(12) United States Patent
Kim et al.

(10) Patent No.: US 10,003,048 B2
(45) Date of Patent: Jun. 19, 2018

(54) OPTICAL FILM AND OLED DISPLAY HAVING THE SAME

(71) Applicant: SAMSUNG SDI CO., LTD., Yongin-si, Gyeonggi-do (KR)

(72) Inventors: Ran Kim, Suwon-si (KR); So Hee Yu, Suwon-si (KR); Seung Kyu Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days. days.

(21) Appl. No.: 15/096,117

(22) Filed: Apr. 11, 2016

(65) Prior Publication Data

US 2016/0308170 A1    Oct. 20, 2016

(30) Foreign Application Priority Data

Apr. 16, 2015  (KR) .................. 10-2015-0053724

(51) Int. Cl.
*H01L 51/52*  (2006.01)
*G02B 1/14*   (2015.01)
*G02B 5/30*   (2006.01)

(52) U.S. Cl.
CPC ............ *H01L 51/5281* (2013.01); *G02B 1/14* (2015.01); *G02B 5/3033* (2013.01); *H01L 51/5253* (2013.01)

(58) Field of Classification Search
CPC ............ H01L 51/5281; H01L 51/5253; G02B 5/3033; G02B 1/14
USPC ......................................... 257/40
See application file for complete search history.

(56) References Cited

U.S. PATENT DOCUMENTS

| 2004/0051445 A1* | 3/2004 | Adachi ............... G02B 5/3016 313/504 |
| 2009/0137743 A1* | 5/2009 | Ito ........................ C08F 8/16 525/223 |
| 2010/0007270 A1* | 1/2010 | Suh ..................... H01L 27/322 313/504 |
| 2015/0285978 A1* | 10/2015 | Chang ............. B29D 11/00788 349/194 |

FOREIGN PATENT DOCUMENTS

| CN | 101001910 A | 7/2007 |
| CN | 101049736 A | 10/2007 |
| CN | 104218053 A | 12/2014 |
| JP | 2003-322703 A | 11/2003 |
| JP | 2005-187770 A | 7/2005 |
| KR | 10-2014-0032819 A | 3/2014 |
| KR | 10-1436441 B1 | 9/2014 |
| TW | 201435442 A | 9/2014 |

OTHER PUBLICATIONS

SIPO Office Action dated Jun. 7, 2017, for corresponding Chinese Patent Application No. 201610235830.1 (10 pages).

* cited by examiner

*Primary Examiner* — Fernando L Toledo
*Assistant Examiner* — Adam S Bowen
(74) *Attorney, Agent, or Firm* — Lewis Roca Rothgerber Christie LLP

(57) ABSTRACT

An optical film, an organic light-emitting diode (OLED) display, and a method of fabricating an OLED display are provided. An optical film includes: a polarizer; and a protective film on at least one surface of the polarizer, and an in-plane retardation of the protective film is from 0 nm to 300 nm, and a reflectance of the optical film is from 0 to 5%.

13 Claims, 3 Drawing Sheets

OPTICAL FILM AND OLED DISPLAY HAVING THE SAME

CROSS-REFERENCE TO RELATED APPLICATION

This application claims priority to Korean Patent Application No. 10-2015-0053724, filed on Apr. 16, 2015 in the Korean Intellectual Property Office, the entire content of which is incorporated herein by reference.

BACKGROUND

1. Field

Aspects of embodiments of the present invention relate to an optical film and an organic light-emitting diode (OLED) display having the same.

2. Description of the Related Art

In accordance with the progress and maturation of modern information technology and society, display devices have increasingly become faced with market demands for larger and thinner display devices that related-art cathode ray tube (CRT) devices cannot meet, and, as a result, the demand for display devices such as a plasma display panel (PDP) device, a liquid crystal display (LCD) device, or an organic light-emitting diode (OLED) display device has grown exponentially.

An LCD or an OLED display, for example, optically modulates transmitted light according to an image signal input thereto or causes luminance pixels thereof to "self-emit" light according to the image signal so as to achieve a particular gray level for each pixel. A layer that either modulates transmitted light or causes luminance to vary from one pixel to another pixel is referred to as a modulation function layer. In an LCD, a liquid crystal layer corresponds to a modulation function layer, and in an OLED display, an organic electroluminescent (EL) layer corresponds to a modulation function layer.

Since the liquid crystal layer is not a light valve capable of completely blocking light, a polarizing plate may be provided at both the top and bottom of the liquid crystal layer, i.e. on backlight- and viewer-sides of the liquid crystal layer.

In the meantime, research has been conducted on ways to display an image with excellent colors while preventing the image from being distorted by the reflection of external light.

SUMMARY

According to an aspect of embodiments of the present invention, an optical film is capable of rendering excellent colors by preventing or substantially preventing the reflection of light at an interface of a display panel and is also capable of preventing or substantially preventing the occurrence of the Mura effect.

According to another aspect of embodiments of the present invention, an organic light-emitting diode (OLED) display has the optical film.

The above and other aspects of the present invention will become more apparent to one of ordinary skill in the field to which the invention pertains by referencing the description with regard to some exemplary embodiments of the present invention set forth below.

An optical film according to one or more exemplary embodiments of the present invention includes: a polarizer; and a protective film on at least one surface of the polarizer, and an in-plane retardation of the protective film is from 0 nm to 300 nm, and a reflectance of the optical film is from 0 to 5%.

An organic light-emitting diode (OLED) display according to one or more exemplary embodiments of the present invention includes a display panel including an OLED and a polarizing plate on at least one surface of the display panel, the polarizing plate including a polarizer and a protective film formed on at least one surface of the polarizer, and an in-plane retardation Re of the protective film is from 0 nm to 300 nm, and a reflectance of the optical film is from 0 to 5%.

The polarizing plate may be arranged on a viewer side of the display panel.

The display panel may further include a base substrate and an encapsulation layer, which face each other; a first electrode and a second electrode, which are formed between the base substrate and the encapsulation layer and face each other and an organic light-emitting layer disposed between the first electrode and the second electrode.

The display panel may further include at least one of a hole transport layer and a hole injection layer, which are formed between the first electrode and the organic light-emitting layer and supply holes from the first electrode to the organic light-emitting layer and at least one of an electron transport layer and an electron injection layer, which are formed between the second electrode and the organic light-emitting layer and supply electrons from the second electrode to the organic light-emitting layer.

A thickness retardation $R_{th}$ of the protective film may be from 100 nm to 2500 nm.

A thickness of the protective film may be from 10 μm to 40 μm.

The protective film may include polyethylene terephthalate (PET), polyethylene naphthalate (PEN), or a copolymer thereof.

The protective film may have a triple co-extruded structure comprising PET, PEN, or a copolymer thereof.

A method of fabricating an OLED display according to another exemplary embodiment of the present invention comprises preparing a display panel, which includes a base substrate and an encapsulation layer facing each other and an OLED formed between the base substrate and the encapsulation layer; and forming a polarizing plate on the encapsulation layer, the polarizing plate includes a polarizer and a protective film, which is formed on at least one surface of the polarizer, and an in-plane retardation Re of the protective film is from 0 nm to 300 nm, and a reflectance of the optical film is from 0 to 5%.

The preparing the display panel may comprise forming a first electrode on the base substrate, forming at least one organic light-emitting layer on the first electrode, forming a second electrode on the organic light-emitting layer and forming the encapsulation layer on the second electrode. According to one or more exemplary embodiments, it is possible to render excellent colors by preventing or substantially preventing the reflection of light at an interface of a display panel and to prevent or substantially prevent the occurrence of the Mura effect.

According to an aspect of one or more embodiments of the present invention, an OLED display is capable of rendering excellent colors by preventing or substantially preventing the reflection of light at an interface of a display panel and is also capable of preventing or substantially preventing the occurrence of the Mura effect.

Other aspects and features, and exemplary embodiments, of the present invention will be apparent from the following detailed description, the drawings, and the claims.

BRIEF DESCRIPTION OF THE DRAWINGS

The accompanying drawings, which are included to provide a further understanding of aspects of the present invention, and are incorporated in and constitute a part of this specification, illustrate some exemplary embodiments of the present invention, and, together with the description, serve to explain principles of the present invention.

DETAILED DESCRIPTION

Figure 1:
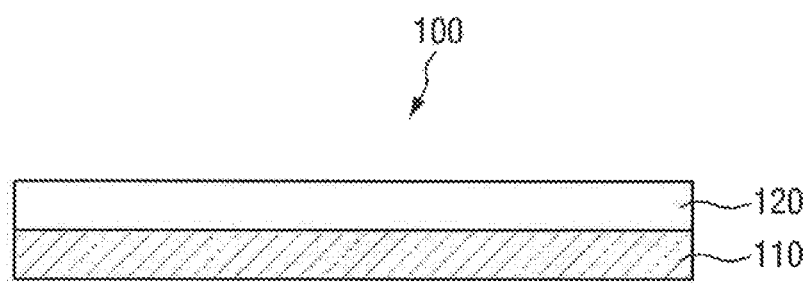
FIG. 1 is a cross-sectional view of an optical film according to an exemplary embodiment of the present invention.

In the following description, for the purpose of explanation, numerous details are set forth in order to provide a thorough understanding of some exemplary embodiments. It is apparent, however, that various exemplary embodiments may be practiced without these specific details or with one or more equivalent arrangements. In some instances, well-known structures and devices may be shown in block diagram form in order to avoid unnecessarily obscuring aspects of some exemplary embodiments of the present invention.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer, or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting of the present invention. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Optical Film

FIG. 1 is a cross-sectional view of an optical film according to an exemplary embodiment of the present invention. Referring to FIG. 1, an optical film 100 may include a polarizer 110 and a protective film 120, which is formed on at least one surface of the polarizer 110. An in-plane retardation Re of the protective film 120 may be in the range from 0 nm to 300 nm, and the reflectance of the optical film 100 may be in the range from 0 to 5%. As a result of the protective film 120 satisfying the aforementioned phase retardation range, any rainbow stains caused by the birefringence of the protective film 120 may be prevented or substantially prevented from becoming visible from the outside of the optical film 100.

The reflectance of the optical film 100 may be measured using a measurement device, such as a CM-3600A spectrophotometer. In one embodiment, the reflectance of the optical film 100 may be measured by setting the measurement device to a reflection mode in a state in which the polarizer 110 and the protective film 120 are laminated together.

As a result of the optical film 100 satisfying the aforementioned reflectance range, the reflection at the interface between the protective film 120 and the polarizer 110 may be reduced so as to reduce the reflection of external light, and, as a result, excellent colors may be realized. Also, by reducing interface reflection between elements, excellent reflection colors and an improved contrast ratio (CR) may be provided.

As a result of the protective film 120 satisfying the aforementioned phase retardation range, the protective film 120 may behave as a negative C plate, and the effective phase retardation on the sides thereof may become zero so as to prevent or substantially prevent any rainbow pattern from becoming visible.

The polarizer 110 is a film capable of converting natural light or polarized light into arbitrarily polarized light, and may generally convert light into linearly polarized light. The polarizer 110 may be a polarizer prepared by adsorbing a dichroic material such as iodine or a dichroic dye to a hydrophilic polymer film, such as a polyvinyl alcohol film, a partially formalized polyvinyl alcohol film, an ethylene-vinyl acetate copolymer-based partially saponified film, or the like and stretching the hydrophilic polymer film, or a polyene oriented film, such as a dehydrated material of polyvinyl alcohol or a dehydrochlorinated material of polyvinyl chloride, or the like, but the invention is not limited thereto. In an exemplary embodiment, the polarizer 110 may be a polyvinyl alcohol film containing iodine, which has a high degree of polarization and exhibits excellent adhesiveness to the protective film 120, but the invention is not limited thereto.

A thickness retardation $R_{th}$ of the protective film 120 may range from 100 nm to 2500 nm. For example, the thickness retardation $R_{th}$ may range from 500 nm to 2000 nm, from 700 nm to 1600 nm, or from 800 nm to 2000 nm. As a result of the optical film 100 which satisfies the aforementioned thickness retardation ranges being applied to an organic light-emitting diode (OLED) display, the OLED display may prevent or substantially prevent any rainbow pattern from becoming visible.

The in-plane retardation Re and the thickness retardation $R_{th}$ may be defined by the following equations:

$$Re = (nx - ny) \times d; \text{ and}$$

$$R_{th} = ((nx + ny)/2 - nz) \times d$$

where d represents the thickness of the protective film 120, nx represents the refractive index of the protective film 120 in a direction of an in-plane slow axis of the protective film 120, ny represents the refractive index of the protective film 120 in a direction of an in-plane fast axis of the protective film 120, and nz represents the refractive index of the protective film 120 in a direction of the thickness of the protective film 120.

The in-plane retardation Re and the thickness retardation $R_{th}$ may both be defined as absolute values, i.e. positive values.

The slow axis of the protective film 120 may be defined as an axis along which the in-plane refractive index of the protective film 120 is maximized, and the fast axis of the protective film 120 may be defined as an axis perpendicular, in-plane, to the slow axis of the protective film 120.

If the value of θr-p (where θr and p represent the fast axis and the absorption axis, respectively, of the protective film 120) is not 90° or 0°, i.e. if the fast axis and the absorption axis of the protective film 120 are neither perpendicular (90°) nor parallel (0°) to each other, a rainbow pattern may become visible due to the influence of phase retardation birefringence. If a polarizing plate including the optical film 100 is provided at a visible side of an OLED display and the protective film 120 is located at the end of a visible direction of the OLED display, no rainbow stain may be visible regardless of the value of θr-p.

The protective film 120 may contain a polyester material. Examples of the polyester material include dicarboxylic acids, such as dicarboxylic acids such as terephthalic acid, isophthalic acid, orthophthalic acid, 2,5-naphthalenedicarboxylic acid, 2,6-naphthalenedicarboxylic acid, 1,4-naphthalenedicarboxylic acid, 1,5-naphthalenedicarboxylic acid, diphenyl carboxylic acid, diphenoxyethane dicarboxylic acid, diphenyl sulfone carboxylic acid, anthracene dicarboxylic acid, 1,3-cyclopentane dicarboxylic acid, 1,3-cyclohexanedicarboxylic acid, 1, 4-cyclohexane dicarboxylic acid, hexahydro terephthalic acid, hexahydro isophthalic acid, malonic acid, dimethyl malonic acid, succinic acid, 3,3-diethyl succinic acid, glutaric acid, 2,2-dimethyl glutaric acid, adipic acid, 2-methyl adipic acid, trimethyl adipic acid, pimelic acid, azelaic acid, dimer acid, sebacic acid, suberic acid, dodeca dicarboxylic acid, and the like, and diols such as ethylene glycol, propylene glycol, hexamethylene glycol, neopentyl glycol, 1,2-cyclohexanedimethanol, 1,4-cyclohexanedimethanol, decamethylene glycol, 1,3-propanediol, 1,4-butanediol, 1,5-pentanediol, 1,6-hexamethylene diol, 2,2-bis (4-hydroxyphenyl) propane, bis (4-hydroxyphenyl) sulfone, and the like, but the invention is not limited thereto. The polyester material may be a homopolymer obtained by polycondensation of one of the foregoing dicarboxylic acids or a homopolymer obtained by polycondensation of one of the foregoing diols. The polyester material may be a copolymer obtained by polycondensation of one or more of the foregoing dicarboxylic acids with two or more of the foregoing diols or a copolymer obtained by polycondensation of two or more of the foregoing dicarboxylic acids with one or more of the foregoing diols. The polyester material may be a blended resin obtained by blending two or more such homopolymers and copolymers.

In an exemplary embodiment, an aromatic polyester such as, for example, polyethylene terephthalate (PET), polyethylene naphthalate (PEN) or a copolymer thereof, may be used, but the invention is not limited thereto.

The protective film 120 may have a triple co-extruded structure comprising PET, PEN, or a copolymer resin thereof.

A polyester film may be fabricated by melt-extruding a polyester resin into a film, and cooling and solidifying the film with a casting drum. In an exemplary embodiment, from the perspective that crystallinity is imparted to a polyester film so as to achieve the aforementioned characteristics of the protective film 120, a stretched polyester film, and particularly, a biaxially stretched polyester film, may be used. As a result of a film having aromatic polyester as a main component thereof being used as a first protective film, the film may also include an additional resin other than aromatic polyester or additives.

As a result of the protective film 120 being provided as a stretched film, various stretching methods such as a longitudinal uniaxial stretching method, a transverse uniaxial stretching method, a longitudinal/latitudinal sequential biaxial stretching method, and a longitudinal/latitudinal simultaneous biaxial stretching method may be used without limitation. In an exemplary embodiment, a simultaneous biaxial stretching method may be used to form the protective film 120, but the invention is not limited thereto. Various stretching means such as a roll stretching machine, a tenter stretching machine, or a pantograph- or linear motor-type biaxial stretching machine may be used to form the protective film 120.

The thickness of the protective film 120 may range from 10 μm to 40 μm to achieve thinness, but the invention is not limited thereto.

Figure 2:
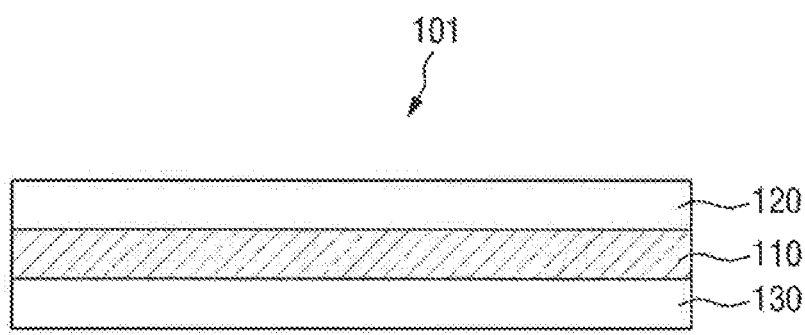
FIG. 2 is a cross-sectional view of an optical film according to another exemplary embodiment of the present invention.

FIG. 2 is a cross-sectional view of an optical film according to another exemplary embodiment of the invention. Referring to FIG. 2, an optical film 101 may include protective films 120 and 130, which are provided on both surfaces of a polarizer 110, and each of the protective films 120 and 130 may be attached onto the polarizer 110 with an adhesive interposed therebetween. Other aspects of the optical film 101 may be the same or generally the same as those of the optical film 100 described above with respect to FIG. 1 and, thus, repeated description thereof will be omitted.

Figure 3:
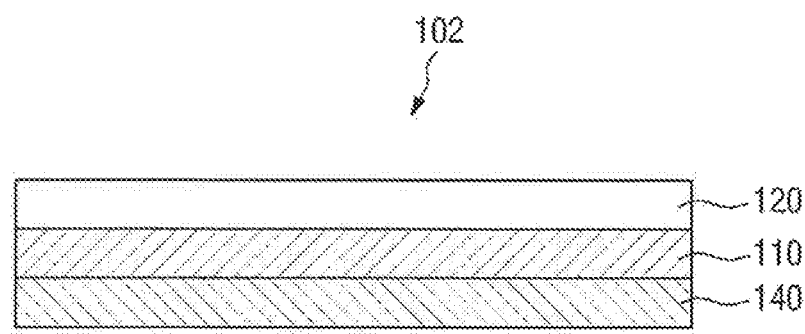
FIG. 3 is a cross-sectional view of an optical film according to another exemplary embodiment of the present invention.

FIG. 3 is a cross-sectional view of an optical film according to another exemplary embodiment of the invention. Referring to FIG. 3, an optical film 102 includes a protective film 120, which is provided on one surface of a polarizer 110, and an adhesive 140, which is provided on the other surface of the polarizer 110. In one embodiment, the protective film 120 is provided on only one surface of the polarizer 110, and the optical film 102 may be sufficiently thin. Other aspects of the optical film 102 may be the same or generally the same as those of the optical film 100 described above with respect to FIG. 1 and, thus, repeated description thereof will be omitted.

Method of Fabricating Optical Film

Although not specifically illustrated, a method of fabricating an optical film according to an exemplary embodiment of the invention may include a step of preparing a polarizer dyed and oriented with iodine or a dichroic dye, a step of preparing a protective film with an in-plane retardation Re of 0 nm to 300 nm, and a step of attaching the protective film on at least one surface of the polarizer.

The step of preparing the polarizer may be performed by a fabricating method of a typical polarizer. That is, the step of preparing the polarizer may be fabricated by subjecting a polyvinyl alcohol film to dyeing, crosslinking, and stretching processes or by attaching a polyvinyl alcohol film onto a base film and then subjecting the polyvinyl alcohol film to the dyeing, crosslinking, and stretching processes.

In one embodiment, the dyeing process may be a process of injecting iodine, a dichroic dye or pigment, or a mixture thereof into a polyvinyl alcohol film so as to be adsorbed into the polyvinyl alcohol film. Molecules of the iodine or the dichroic dye or pigment absorb light vibrating in a direction in which a polarizer film is stretched and transmit therethrough light vibrating in a perpendicular direction to the direction in which the polarizing film is stretched, thereby obtaining polarized light having a particular vibration direction.

The dyeing process may be performed by immersing the polyvinyl alcohol film or a stack film obtained by laminating the polyvinyl alcohol film on a base film in a solution of iodine or a dichroic material. In one embodiment, for example, the polyvinyl alcohol film or the stack film may be immersed in an iodine solution with a temperature of 20° C. to 50° C. for 10 seconds to 300 seconds. In response to an aqueous iodine solution being used as the iodine solution, an aqueous solution containing iodine ($I_2$) and iodine ions, for example, potassium iodide (KI), which is used as a solubilizer, may be used. In an exemplary embodiment, the aqueous iodine solution may contain 0.01 to 0.5% by weight of $I_2$ and 0.01 to 10% by weight of KI.

In an exemplary embodiment, a swelling process may be additionally performed before the dyeing process. The swelling process may relax the molecular chain of the polyvinyl alcohol film and may thus allow a dichroic material to be uniformly or substantially uniformly adsorbed into the polyvinyl alcohol film during the dyeing process without leaving stains. During the swelling process, the polyvinyl alcohol film may be stretched. In an exemplary embodiment, the swelling process may be performed in a wet method in a swelling tub in which a swelling liquid is contained. The temperature at which the swelling process is performed may vary depending on the thickness of the polyvinyl alcohol film, and may range from 15° C. to 40° C., for example In another exemplary embodiment, a crosslinking process may be additionally performed after the dyeing process.

In one embodiment, once the polyvinyl alcohol film is dyed with molecules of iodine or a dichroic material in the dyeing process, the iodine or dichroic material molecules may be adsorbed onto a polymer matrix of the polyvinyl alcohol film using boric acid or borate. The crosslinking process may be performed using a dipping method in which the polyvinyl alcohol film is dipped in a boric acid solution or the like, but the invention is not limited thereto. That is, the crosslinking process may be performed using a method of applying or spraying a solution onto a film.

The stretching process may be performed using a wet stretching method and a dry stretching method, which are already well known in the art to which the invention pertains.

Non-limiting examples of the dry stretching method include an inter-roll stretching method, a heating roll stretching method, a compression stretching method, and a tenter stretching method, and non-limiting examples of the wet stretching method include a tenter stretching method and an inter-roll stretching method.

Due to the wet stretching method being used, the polyvinyl alcohol film may be stretched in alcohol, water, or a boric acid solution, and a solvent such as methyl alcohol, propyl alcohol, or the like may be used. However, the invention is not limited thereto.

The temperature at which, and the duration for which, the polyvinyl alcohol film is stretched may be appropriately selected and used according to the material and the use of the polyvinyl alcohol film, and a desired stretching rate. The stretching process may be a uniaxial or biaxial stretching process.

The dyeing process and the stretching process may not necessarily be performed in the same order as that set forth herein, and may be performed in a different order depending on processing equipment and installation. The stretching process and either the dyeing process or the crosslinking process may be performed at the same time, as necessary. In response to the stretching process and the dyeing process being performed at the same time, the stretching process may be performed in an iodine solution. In response to the stretching process and the crosslinking process being performed at the same time, the stretching process may be performed in a boric acid solution.

Due to the stack film having the base film being used, a process of removing the base film from the stack film may also be performed so as to obtain a polyvinyl alcohol film dyed and oriented with iodine or a dichroic dye, i.e. a polarizer.

The step of preparing the polarizer, as performed in the method of fabricating an optical film according to an exemplary embodiment, is exemplary, and various methods of fabricating a polarizer may be used without limitation.

The step of preparing the protective film with the in-plane retardation Re of 0 nm to 300 nm may include a step of fabricating an unstretched polyester film and a step of stretching the unstretched polyester film.

The step of fabricating the unstretched polyester film is not particularly limited and, for example, a melt extrusion method may be used. In one embodiment, an unstretched polyester film may be fabricated by melting a polyester material at a temperature higher than the melting temperature of the polyester material and ejecting the melted polyester material out of extrusion equipment.

The melt extrusion method is described below in further detail.

During a melt extrusion process, if the moisture content of a film material exceeds a certain level (e.g., a predefined level), product defects such as "orange-peel" like bubble artifacts may occur, and, thus, the moisture content of the film material needs to be maintained below the certain level. The type of dryer used is not particularly limited. For example, various dryers such as a dehumidifying dryer, a hot air dryer, or the like may be used, but the invention is not limited thereto. A drying process may be performed at a temperature below the glass transition temperature of the film material, but the temperature of the drying process may be appropriately selected depending on the type and the glass transition temperature of resin used. If the temperature of the drying process is too low, no drying effect may be obtained. On the other hand, if the temperature of the drying process is too high, the characteristics of the film material may be changed, which is undesirable. In one embodiment, the film material may be dried for 0.5 hours to 5 hours, but the duration of the drying process may be appropriately determined in consideration of the ambient humidity.

The dried film material may be supplied into a raw material storage (e.g., a hopper) at the inlet of extrusion equipment. To primarily remove impurities from the film material, the film material may be subjected to a filtration device, as necessary, while circulating the air in the raw material storage.

The film material injected into the extrusion equipment may fill a first section of a screw in the extrusion equipment. The first section transfers the film material to a cylinder of the extrusion equipment.

A second section of the screw is a region where the melting of the film material begins, and may be set to a temperature above the glass transition temperature of the film material.

A third section of the screw is a region where the film material is completely transformed into a molten material, and the same temperature range as in the second section may be maintained in the third section.

A fourth section of the screw increases the pressure of the molten material so as to increase the density of the molten material and thus to ensure the molten material to be ejected by a stable amount. The same temperature range as in the second and third sections may be maintained in the fourth section in order for the molten material not to be cured while being ejected.

The molten material may be fed to a gear pump, which transfers the molten material to a T die by a uniform amount. If the molten material is transferred directly to the T die through the screw inside the cylinder of the extrusion equipment, the amount by which the molten material is transferred to the T die at any given time may become irregular, and, thus, a product of excellent quality may not be able to be obtained. The gear pump stores in a particular space the molten material irregularly fed thereto from the cylinder of the extrusion equipment and then stably supplies the stored molten material to the T die by a uniform or substantially uniform amount, thereby minimizing or reducing variations in the distribution of pressure.

A region where the molten material is finally ejected out of the extrusion equipment is a T die section. The shape and thickness of a film product are determined by the shape of the T die. The T die may be classified into a T-shaped die, a coat hanger die, or a fish tail die, but the invention is not limited thereto. Various types of T dies may be used depending on the fluidity of the molten material.

The step of stretching the unstretched polyester film may be performed using a wet stretching method and a dry stretching method, which are already well known in the field to which the invention pertains.

Non-limiting examples of the dry stretching method include an inter-roll stretching method, a heating roll stretching method, a compression stretching method, and a tenter stretching method, and non-limiting examples of the wet stretching method include a tenter stretching method and an inter-roll stretching method.

Due to the wet stretching method being used, the polyvinyl alcohol film may be stretched in alcohol, water, or a boric acid solution, and a solvent such as methyl alcohol, propyl alcohol, or the like may be used. However, the invention is not limited thereto.

The step of stretching the unstretched polyester film may also be performed using a transverse uniaxial stretching method, a longitudinal sequential biaxial stretching method, and a longitudinal/transverse simultaneous biaxial stretching method.

In an exemplary embodiment, to achieve the in-plane retardation Re of 0 nm to 300 nm, a biaxial stretching method, and particularly, a simultaneous biaxial stretching method, may be used, but the invention is not limited thereto.

In the step of stretching the unstretched polyester film, the ratio (MD:TD) at which an unstretched polyester film is stretched is not particularly limited, but the unstretched polyester film may be stretched at a ratio of, for example, 2.0:1.0-3.0 to 3.0:2.0-4.0. That is, the rate at which the unstretched polyester film is stretched in a transverse direction (TD) may be set to be ±1.0 times the rate at which the unstretched polyester film is stretched in a machine direction (MD), and the rate at which the unstretched polyester film is stretched in the MD may be set to be 2.0 to 3.0 times the rate at which the unstretched polyester film is stretched in the TD.

Thereafter, the step of attaching the protective film on at least one surface of the polarizer may be performed. A water-based adhesive may be used to attach the protective film on the polarizer. The water-based adhesive is of common use in the field to which the invention pertains, and thus, a detailed description thereof will be omitted.

OLED Display

Figure 4:
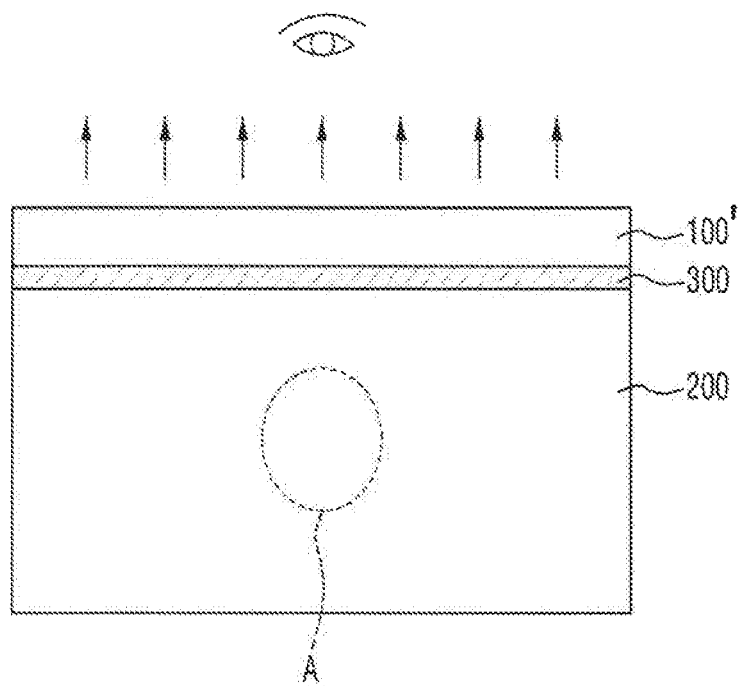
FIG. 4 is a schematic cross-sectional view of an organic light-emitting diode (OLED) display according to another exemplary embodiment of the present invention.

FIG. 4 is a schematic cross-sectional view of an OLED display according to an exemplary embodiment of the invention. Referring to FIG. 4, the OLED display may include a display panel 200, which has an OLED, and a polarizing plate 100' which is disposed on at least one surface of the display panel 200. The polarizing plate 100' may include an optical film such as the optical film 100 described above. That is, the polarizing plate 100' may include a polarizer and a protective film, such as the polarizer 110 and the protective film 120 described above. An in-plane retardation Re of the protective film may be in the range from 0 nm to 300 nm, and the reflectance of the polarizing plate 100' may be in the range from 0 to 5%.

Due to the polarizing plate 100' including the optical film 101 of FIG. 2, the polarizing plate 100' may be attached onto the display panel 200 with an adhesive 300 interposed therebetween, but the invention is not limited thereto. That is, in one embodiment, due to the protective film being formed on one surface of the polarizer and an adhesive being provided on the other surface of the polarizer, as illustrated in FIG. 3, the polarizing plate 100' may be attached onto the display panel 200 by using the adhesive provided on the other surface of the polarizer.

A thickness retardation $R_{th}$ of the protective film may range from 100 nm to 2500 nm. For example, the thickness retardation $R_{th}$ may range from 500 nm to 2000 nm, from 700 nm to 1600 nm, or from 800 nm to 2000 nm. The thickness of the protective film may range from 10 μm to 40 μm. The protective film may contain polyethylene terephthalate, polyethylene naphthalate, or a copolymer thereof and may have a triple co-extruded structure comprising PET, PEN, or a copolymer thereof. The protective film may be a protective film as described above, and thus, a detailed description thereof will be omitted.

The polarizing plate 100' may be disposed on a viewer side of the display panel 200. That is, the polarizing plate 100' may be attached on a side of the display panel 200 where an image is displayed to be viewed by a viewer. The polarizing plate 100' may be disposed on the viewer side of the display panel 200, thereby reducing the reflection of external light so as to render excellent colors.

The protective film of the polarizing plate 100' may be disposed on the outermost viewer side of the display panel 200. Thus, any rainbow stains caused by the birefringence of the protective film may be prevented or substantially prevented from becoming visible from the outside of the OLED display. Also, color degradation that may be caused by the reflection of external light may be prevented or substantially prevented.

The display panel 200 may include a base substrate 201 and an encapsulation layer 202, which face each other, and the OLED may be formed between the base substrate 201 and the encapsulation layer 202. The OLED may include a first electrode and a second electrode, which face each other, and an organic light-emitting layer, which is interposed between the first electrode and the second electrode. In one embodiment, the first electrode and the second electrode, which face each other, may be formed between the base substrate 201 and the encapsulation layer 202. The first electrode may be formed to be closer than the second electrode to the base substrate 201, the second electrode may be formed to be closer than the first electrode to the encapsulation layer 202, and the organic light-emitting layer may be disposed between the first electrode and the second electrode.

Figure 5:
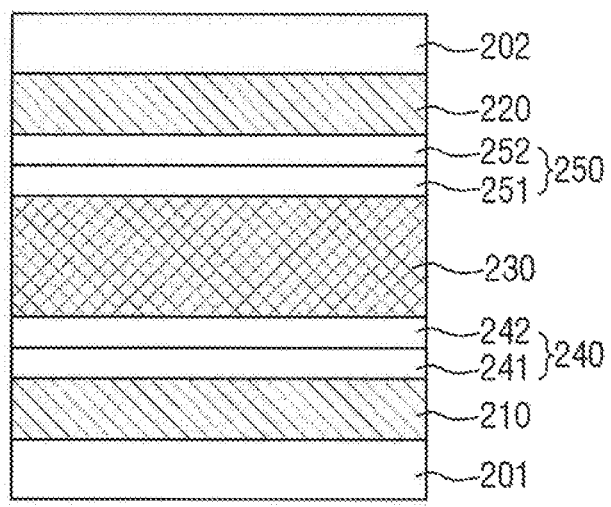
FIG. 5 is an enlarged cross-sectional view of a region "A" of the OLED display of FIG. 4.

FIG. 5 is an enlarged cross-sectional view of a region "A" of FIG. 4. The OLED is described below in further detail with reference to FIG. 5.

The OLED may be disposed on the base substrate 201, and may include a first electrode 210 and a second electrode 220, which face each other, and an organic light-emitting layer 230, which is disposed between the first electrode 210 and the second electrode 220. A first charge transfer region 240 may be provided between the first electrode 210 and the organic light-emitting layer 230. A second charge transfer region 250 may be provided between the organic light-emitting layer 230 and the second electrode 220.

One of the first electrode 210 and the second electrode 220, which face each other with the organic light-emitting layer 230 interposed therebetween, may be an anode electrode, and the other electrode may be a cathode electrode. One of the first charge transfer region 240 and the second charge transfer region 250 may transfer holes, and the other region may transfer electrons.

In the present exemplary embodiment, the first electrode 210 and the second electrode 220 may be an anode electrode and a cathode electrode, respectively, and accordingly, the first charge transfer region 240 and the second charge transfer region 250 may be a hole transfer region and an electron transfer region, respectively.

The base substrate 201 may include an insulating substrate, and the insulating substrate may be a flexible substrate formed of glass, quartz, a polymer resin, or a flexible material, such as polyimide (PI).

Although not specifically illustrated, the base substrate 201 may also include other structures disposed on the insulating substrate. Examples of the other structures include wires, electrodes, insulating layers, and the like. In some exemplary embodiments, the base substrate 201 may include a plurality of thin-film transistors (TFTs). The drain electrodes of at least some of the TFTs may be electrically connected to the first electrode 210. The TFTs may include an active region, which is formed of amorphous silicon, polycrystalline silicon, monocrystalline silicon, or the like.

The first electrode 210 may be disposed on the base substrate 201. The first electrode 210 may be disposed in each pixel of the OLED display. The first electrode 210 may contain a conductive material with a higher work function than the material of the second electrode 220. For example, the first electrode 210 may contain indium tin oxide (ITO), indium zinc oxide (IZO), zinc oxide (ZnO), indium oxide ($In_2O_3$), silver (Ag), magnesium (Mg), aluminum (Al), platinum (Pt), lead (Pb), gold (Au), nickel (Ni), neodium (Nd), iridium (Ir), chromium (Cr), lithium (Li), calcium (Ca), or a mixture thereof.

The first charge transfer region 240 may be provided on the first electrode 210. The first charge transfer region 240 may be provided as a single layer formed of either a single material or a plurality of different materials, or a multilayer structure consisting of a plurality of layers formed of a plurality of different materials. The first charge transfer region 240 is illustrated in FIG. 5 as including a first charge injection layer 241 and a first charge transport layer 242, but the invention is not limited thereto. That is, one of the first charge injection layer 241 and the first charge transport layer 242 may not be provided, and the first charge injection layer 241 and the first charge transport layer 242 may be provided as a single layer.

The first charge injection layer 241 is disposed on the first electrode 210 and increases the efficiency of injecting holes from the first electrode 210 into the organic light-emitting layer 230. The first charge injection layer 241 lowers the energy barrier and thus allows holes to be effectively injected.

The first charge transport layer 242 is disposed on the first charge injection layer 241 and transports holes injected from the first charge injection layer 241 to the organic light-emitting layer 230.

The organic light-emitting layer 230 may be disposed on the first charge transfer region 240. The organic light-emitting layer 230 may be formed of any materials that are of common use for forming a light-emitting layer. For example, the organic light-emitting layer 230 may be formed of a material emitting red, green, and blue light. The organic light-emitting layer 230 may contain a fluorescent material or a phosphorescent material. In an exemplary embodiment, the organic light-emitting layer 230 may include a host and a dopant.

The second charge transfer region 250 may be provided on the organic light-emitting layer 230. The second charge transfer region 250 may be provided as a single layer formed of either a single material or a plurality of different materials, or a multilayer structure consisting of a plurality of layers formed of a plurality of different materials. The second charge transfer region 250 is illustrated in FIG. 5 as including a second charge transport layer 251 and a second charge injection layer 252, but the invention is not limited thereto. That is, one of the second charge transport layer 251 and the second charge injection layer 252 may not be provided, and the second charge transport layer 251 and the second charge injection layer 252 may be provided as a single layer.

The second charge transport layer 251 is disposed on the organic light-emitting layer 230 and transports electrons injected from the second charge injection layer 252 to the organic light-emitting layer 230.

The second charge injection layer 252 is disposed on the second charge transport layer 251 and increases the efficiency of injecting electrons from the second electrode 220 into the organic light-emitting layer 230.

The second electrode 220 is disposed on the second charge transfer region 250. The second electrode 220 may be a front electrode or a common electrode for all pixels. The second electrode 220 may contain a conductive material with a lower work function than the material of the first electrode 210. For example, the second electrode 220 may be formed of Li, Ca, LiF/Ca, LiF/Al, Al, Mg, Ag, Pt, Pb, Ni, Au Nd, Ir, Cr, BaF, Ba, or a compound or mixture thereof (such as a mixture of Ag and Mg).

Method of Fabricating OLED Display

Although not specifically illustrated, a method of fabricating an OLED display according to an exemplary embodiment of the invention is provided. The method of fabricating an OLED display according to the present exemplary embodiment includes: a step of preparing a display panel, which includes a base substrate and an encapsulation layer facing each other and an OLED formed between the base substrate and the encapsulation layer; and a step of forming a polarizing plate on the encapsulation layer, wherein the polarizing plate includes a polarizer and a protective film, which is formed on at least one surface of the polarizer, an in-plane retardation Re of the protective film is in the range from 0 nm to 300 nm, and the reflectance of the polarizing plate is in the range from 0 to 5%.

The step of preparing the display panel may include: forming a first electrode on the base substrate; forming at least one organic light-emitting layer on the first electrode; forming a second electrode on the organic light-emitting layer; and forming the encapsulation layer on the second electrode.

The step of preparing the display panel may also include: forming at least one of a hole transport layer and a hole injection layer, which supply holes from the first electrode to the organic light-emitting layer, between the first electrode and the organic light-emitting layer; and forming at least one of an electron transport layer and an electron injection layer, which supply electrons from the second electrode to the organic light-emitting layer, between the second electrode and the organic light-emitting layer.

The OLED including the organic light-emitting layer may be formed by a method using a slit nozzle or an inkjet printing method and may also be formed by a deposition method, a sputtering method, or the like. These methods are already well known in the field to which the invention pertains, and thus, detailed descriptions thereof will be omitted.

Some embodiments of the present invention will hereinafter be described in further detail with reference to various experimental data.

Embodiments 1 to 6

Optical films according to Embodiments 1 to 6 were fabricated by forming, using PET and using melt extrusion and biaxial stretching, a protective film having a thickness (μm), an in-plane retardation Re, and a thickness retardation $R_{th}$ as shown in Table 1 below and bonding the protective film onto a polyvinyl alcohol polarizer containing iodine.

TABLE 1

| Sample | Base Thickness (μm) | Retardation | |
|---|---|---|---|
| | | Re (nm) | $R_{th}$ (nm) |
| Embodiment 1 | 10 | 50 | 520 |
| Embodiment 2 | 20 | 167 | 1217 |
| Embodiment 3 | 20 | 254 | 1278 |
| Embodiment 4 | 30 | 90 | 1190 |
| Embodiment 5 | 40 | 135 | 1260 |
| Embodiment 6 | 40 | 260 | 1190 |

Comparative Examples 1 to 6

Optical films according to Comparative Examples 1 to 6 were fabricated by forming, using PET, a protective film having a thickness (μm), an in-plane retardation Re, and a thickness retardation $R_{th}$ as shown in Table 2 below.

TABLE 2

| Sample | Base Thickness (μm) | Retardation | |
|---|---|---|---|
| | | Re (nm) | $R_{th}$ (nm) |
| Comparative Example 1 | 25 | 10 | 20 |
| Comparative Example 2 | 20 | 50 | 6900 |
| Comparative Example 3 | 20 | 200 | 8000 |
| Comparative Example 4 | 25 | 880 | 5900 |
| Comparative Example 5 | 40 | 3200 | 3800 |
| Comparative Example 6 | 80 | 8500 | 9200 |

Experimental Example

The reflectance of the optical films according to Embodiments 1 to 3 and the optical films according to Comparative Examples 1 to 3 was measured, and the optical films according to Embodiments 1 to 6 and the optical films according to Comparative Examples 1 to 6 were tested for whether they would cause a rainbow phenomenon. More specifically, the reflectance of the optical films according to Embodiments 1 to 3 and the optical films according to Comparative Examples 1 to 3 was measured for Plane-to-Line Switching (PLS) mode and OLED mode, respectively, by using the CM-3600A spectrophotometer. The optical films according to Embodiments 1 to 6 and the optical films according to Comparative Examples 1 to 6 were tested for any rainbow phenomenon through visual assessment. The results of the measurement and the testing are shown in Table 3 below.

TABLE 3

| Sample | Embodiment 1 | Embodiment 2 | Embodiment 3 | Comparative Example 1 | Comparative Example 2 | Comparative Example 3 | Remarks |
|---|---|---|---|---|---|---|---|
| Reflectance | 4.90 | 4.92 | 4.94 | 5.27 | 5.00 | 5.02 | PLS Mode |
| Reflectance | 4.49 | 4.57 | 4.60 | 5.17 | 4.60 | 4.66 | OLED Mode |
| Rainbow Phenomenon (Visual Assessment) | Lv. 0 | Lv. 0 | Lv. 0 | Lv. 0 | Lv. 2 | Lv. 2 | PLS Mode |
| | Lv. 0.5 | Lv. 0 | Lv. 0 | Lv. 0.5 | Lv. 2 | Lv. 2 | OLED Mode |

Referring to Table 3, Level 0 to Level 0.5 indicate that no rainbow phenomenon is visible, and Level 2 indicates that a rainbow phenomenon is highly visible. As is apparent from Table 3, a rainbow phenomenon is less visible in the optical films according to Embodiments 1 to 3 than in the optical films according to Comparative Examples 1 to 3.

What is claimed is:

1. An optical film comprising:
    a polarizer; and
    a protective film on at least one surface of the polarizer,
    wherein an in-plane retardation of the protective film is from 0 nm to 300 nm, and a reflectance of the optical film is from 0 to 5%,
    wherein a thickness retardation of the protective film is from 100 nm to 2500 nm.

2. The optical film of claim 1, wherein a thickness of the protective film is from 10 μm to 40 μm.

3. The optical film of claim 1, wherein the protective film comprises polyethylene terephthalate (PET), polyethylene naphthalate (PEN), or a copolymer thereof.

4. The optical film of claim 3, wherein the protective film has a triple co-extruded structure comprising PET, PEN, or a copolymer thereof.

5. An organic light-emitting diode (OLED) display comprising:
    a display panel comprising an OLED; and
    a polarizing plate on at least one surface of the display panel,
    wherein the polarizing plate comprises a polarizer and a protective film on at least one surface of the polarizer;
    wherein an in-plane retardation of the protective film is from 0 nm to 300 nm, and a reflectance of the polarizing plate is from 0 to 5%,
    wherein a thickness retardation of the protective film is from 100 nm to 2500 nm.

6. The OLED display of claim 5, wherein the polarizing plate is arranged on a viewer side of the display panel.

7. The OLED display of claim 5, wherein a thickness of the protective film is from 10 μm to 40 μm.

8. The OLED display of claim 5, wherein the protective film comprises PET, PEN, or a copolymer thereof.

9. The OLED display of claim 8, wherein the protective film has a triple co-extruded structure comprising PET, PEN, or a copolymer thereof.

10. The OLED display of claim 5, wherein the display panel further comprises:
    a base substrate and an encapsulation layer facing each other;
    a first electrode and a second electrode, the first electrode and the second electrode being between the base substrate and the encapsulation layer and facing each other; and
    an organic light-emitting layer between the first electrode and the second electrode.

11. The OLED display of claim 10, wherein the display panel further comprises:
    at least one of a hole transport layer and a hole injection layer, the at least one of the hole transport layer and the hole injection layer being between the first electrode and the organic light-emitting layer and configured to supply holes from the first electrode to the organic light-emitting layer; and
    at least one of an electron transport layer and an electron injection layer, the at least one of the electron transport layer and the electron injection layer being between the second electrode and the organic light-emitting layer and configured to supply electrons from the second electrode to the organic light-emitting layer.

12. A method of fabricating an OLED display, the method comprising:
    preparing a display panel including a base substrate and an encapsulation layer facing each other, and an OLED between the base substrate and the encapsulation layer; and
    forming a polarizing plate on the encapsulation layer,
    wherein the polarizing plate includes a polarizer, and a protective film on at least one surface of the polarizer, and an in-plane retardation of the protective film is from 0 nm to 300 nm, and a reflectance of the polarizing plate is from 0 to 5%, wherein a thickness retardation of the protective film is from 100 nm to 2500 nm.

13. The method of claim 12, wherein the preparing the display panel comprises:
    forming a first electrode on the base substrate;
    forming at least one organic light-emitting layer on the first electrode;
    forming a second electrode on the organic light-emitting layer; and
    forming the encapsulation layer on the second electrode.

* * * * *